(12) United States Patent
Choi et al.

(10) Patent No.: US 11,024,759 B2
(45) Date of Patent: Jun. 1, 2021

(54) ELECTRONIC DEVICE USING TWO DIMENSIONAL SEMICONDUCTOR MATERIAL

(71) Applicant: KOREA ADVANCED INSTITUTE OF SCIENCE AND TECHNOLOGY, Daejeon (KR)

(72) Inventors: Sung-Yool Choi, Daejeon (KR); Gwang Hyuk Shin, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 188 days.

(21) Appl. No.: 16/226,950

(22) Filed: Dec. 20, 2018

(65) Prior Publication Data

US 2020/0194602 A1    Jun. 18, 2020

(30) Foreign Application Priority Data

Dec. 14, 2018   (KR) ........................ 10-2018-0162126

(51) Int. Cl.
| | |
|---|---|
| *H01L 31/0336* | (2006.01) |
| *H01L 31/10* | (2006.01) |
| *H01L 29/24* | (2006.01) |
| *H01L 29/778* | (2006.01) |

(52) U.S. Cl.
CPC .......... *H01L 31/0336* (2013.01); *H01L 29/24* (2013.01); *H01L 29/7787* (2013.01); *H01L 31/10* (2013.01)

(58) Field of Classification Search
CPC .. H01L 31/0336; H01L 29/24; H01L 29/7787
See application file for complete search history.

(56) References Cited

U.S. PATENT DOCUMENTS

| | | | |
|---|---|---|---|
| 2013/0105824 A1* | 5/2013 | Paranjape | ............. H01L 31/032 257/86 |
| 2013/0234214 A1* | 9/2013 | Yoshida | .................. H01L 31/18 257/239 |
| 2015/0108500 A1* | 4/2015 | Irsigler | .................. H01L 29/267 |
| 2015/0170914 A1* | 6/2015 | Haukka | ............. C23C 16/45525 438/478 |
| 2018/0240607 A1* | 8/2018 | Tsai | ......................... H01G 9/20 |
| 2020/0127130 A1* | 4/2020 | Pogrebnyak | .......... H01L 29/778 |

* cited by examiner

*Primary Examiner* — Thao X Le
*Assistant Examiner* — Xia L Cross
(74) *Attorney, Agent, or Firm* — NSIP Law

(57) ABSTRACT

Provided is an electronic device containing: a two-dimensional semiconductor material; and another heterogeneous material adjacent to the two-dimensional semiconductor material, wherein the heterogeneous material is doped with an impurity of a type different from the two-dimensional semiconductor material or has a band gap different from the two-dimensional semiconductor material.

7 Claims, 5 Drawing Sheets
(5 of 5 Drawing Sheet(s) Filed in Color)

[FIG. 1]
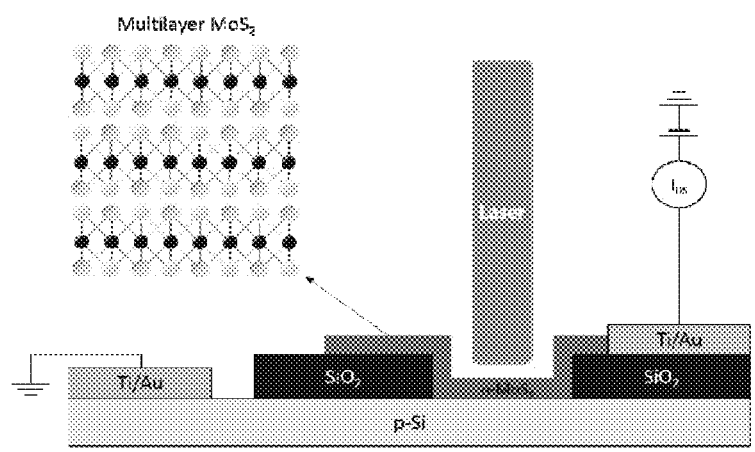
[FIG. 2]
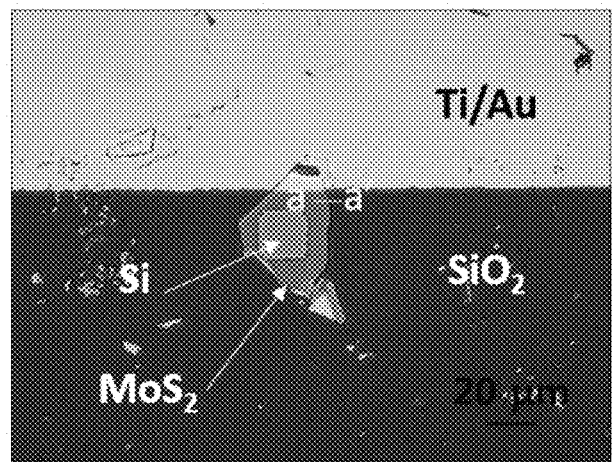

[FIG. 3]
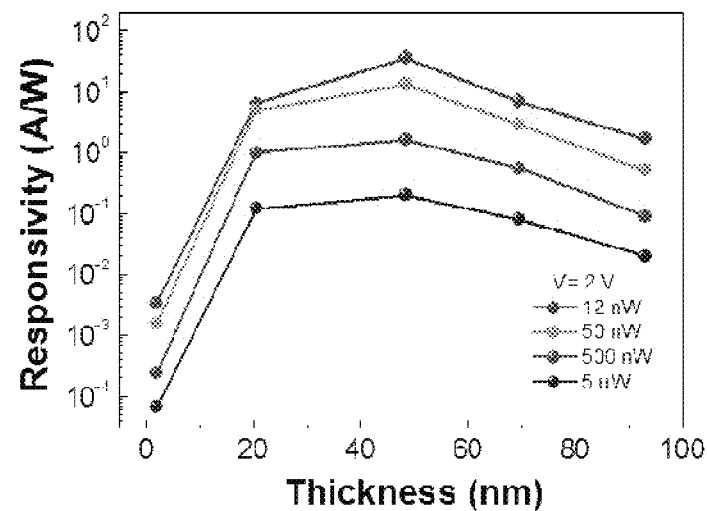
[FIG. 4]
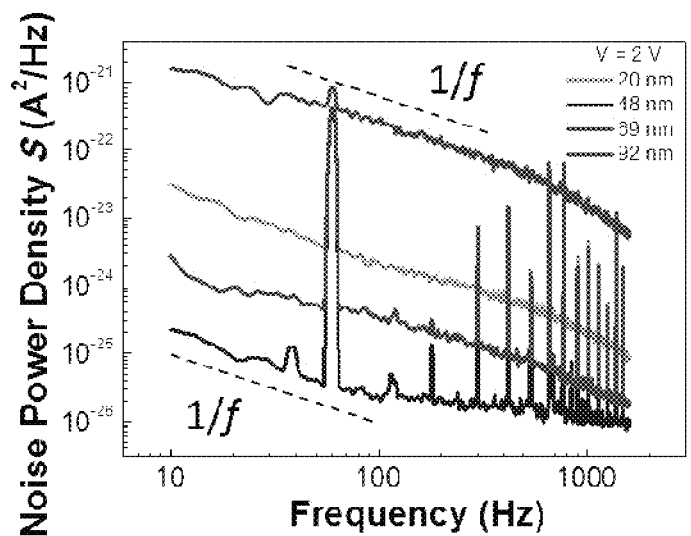

[FIG. 5]
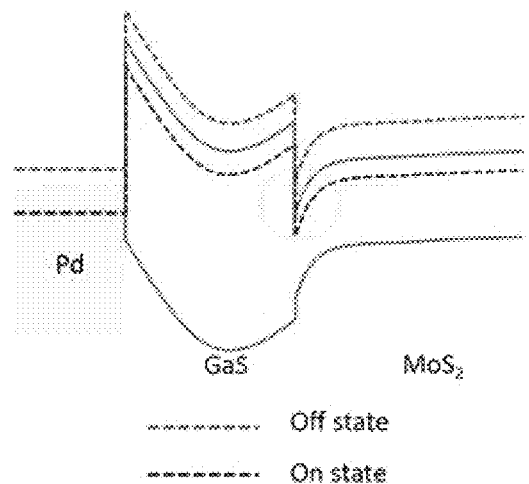
[FIG. 6]
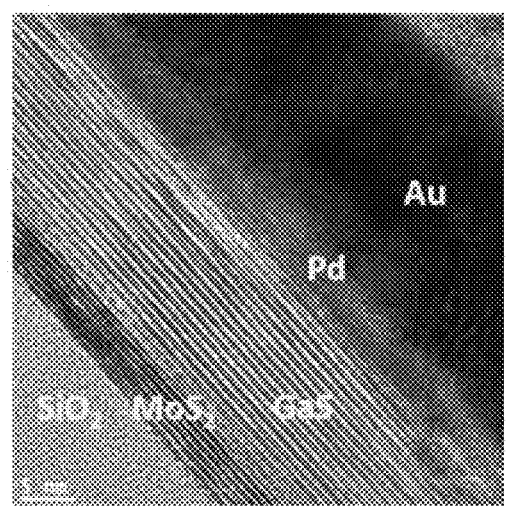

[FIG. 7]
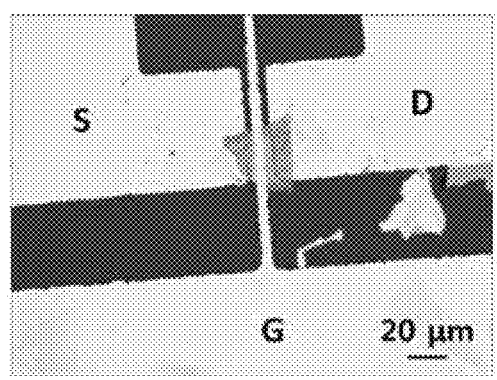

[FIG. 8]
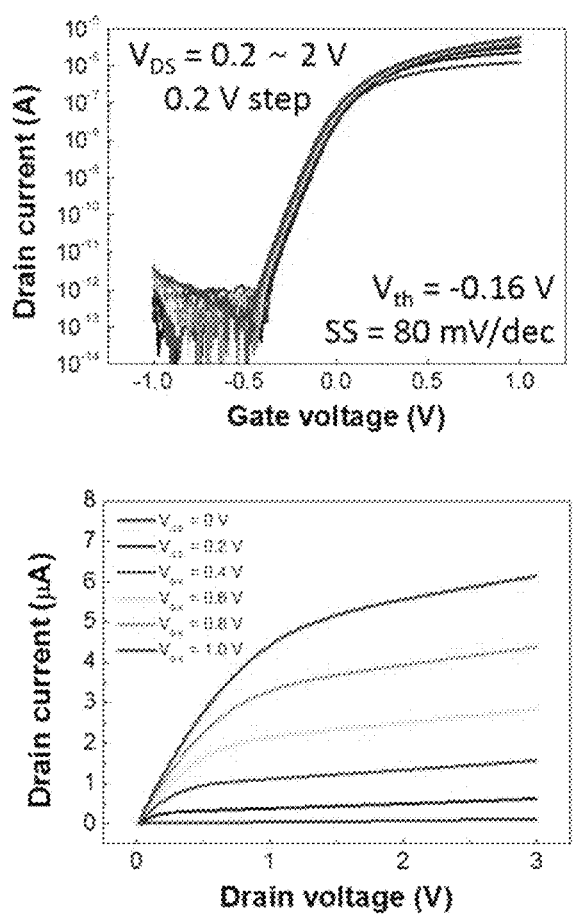

ELECTRONIC DEVICE USING TWO DIMENSIONAL SEMICONDUCTOR MATERIAL

CROSS REFERENCE TO RELATED APPLICATIONS

This application claims the benefit under 35 USC § 119(a) of Korean Patent Application No. 10-2018-0162126 filed on Dec. 14, 2018, in the Korean Intellectual Property Office, the entire disclosure of which is incorporated herein by reference for all purposes.

TECHNICAL FIELD

The present disclosure relates to an electronic device using a two-dimensional semiconductor material, more particularly to an electronic device using the relationship between a two-dimensional semiconductor material and another material.

BACKGROUND ART

Two-dimensional semiconductor materials have drawn attentions due to their superior electrical, mechanical and optical properties. The two-dimensional semiconductor commonly refers to a layered semiconductor material which has strong covalent bonds in the horizontal direction and weak van der Waals bonds in the vertical direction. Although various devices using two-dimensional semiconductor materials, e.g., transition metal dichalcogenide compounds, are disclosed, effective application to devices has not been reported yet.

For example, Korean Patent Publication No. 10-2017-0098053 discloses a thin-film transistor using a transition metal dichalcogenide compound as a channel material on a substrate. However, it uses a two-dimensional semiconductor material as a general channel material and a technology of improving device characteristics by using junction between a two-dimensional material and an adjacent heterogeneous material has not been disclosed.

DISCLOSURE

Technical Problem

The present disclosure is directed to providing an electronic device using the relationship between a two-dimensional semiconductor material and another material.

Technical Solution

The present disclosure provides an electronic device containing: a two-dimensional semiconductor material; and another heterogeneous material adjacent to the two-dimensional semiconductor material, wherein the heterogeneous material is doped with an impurity of a type different from the two-dimensional semiconductor material or has a band gap different from the two-dimensional semiconductor material.

In an exemplary embodiment of the present disclosure, the two-dimensional semiconductor material includes a transition metal dichalcogenide compound.

In an exemplary embodiment of the present disclosure, the another heterogeneous material is a silicon substrate doped with an impurity of a type different from the two-dimensional semiconductor material and the characteristics of a depletion layer of a PN junction between the two-dimensional semiconductor material and the silicon substrate are controlled by the thickness of the two-dimensional semiconductor material.

In an exemplary embodiment of the present disclosure, the electronic device is a photodiode.

In an exemplary embodiment of the present disclosure, the heterogeneous material has a wider band gap than the two-dimensional semiconductor material.

In an exemplary embodiment of the present disclosure, the electronic device is a transistor and a two-dimensional electron gas (2DEG) is formed in the transistor due to the band gap difference of the two-dimensional semiconductor material and the heterogeneous material.

In an exemplary embodiment of the present disclosure, the two-dimensional semiconductor material is $MoS_2$, the heterogeneous material is GaS and the GaS is adjacent to the gate electrode.

In an exemplary embodiment of the present disclosure, the heterogeneous material is crystalline and has insulating property of interrupting leakage current when an electric field is applied to the gate electrode.

Advantageous Effects

According to the present disclosure, a device with improved characteristics may be provided by using the junction characteristics between a two-dimensional material, e.g., a transition metal dichalcogenide compound thin film, and another material adjacent thereto (e.g., a doped silicon substrate or a semiconductor material having a different band gap such as GaS).

BRIEF DESCRIPTION OF DRAWINGS

The patent or application file contains a least one drawing executed in color. Copies of this patent or patent application publication with color drawing(s) will be provided by the Office upon request and payment of the necessary fee.

FIG. 1 shows a cross-sectional view of a Si—$MoS_2$ photodiode of the present disclosure and a condition for optical experiment.

FIG. 2 is an optical microscopic image of a Si—$MoS_2$ photodiode prepared according to an exemplary embodiment of the present disclosure and FIG. 3 shows a result of measuring photoresponsivity depending on the thickness of $MoS_2$.

FIG. 4 shows a result of analyzing low-frequency noise characteristics of a photodiode prepared according to an exemplary embodiment of the present disclosure depending on the thickness of $MoS_2$.

FIG. 5 is the energy band diagram of a $MoS_2$—GaS heterojunction structure-based high-speed transistor device according to the present disclosure.

FIG. 6 is an electron microscopic cross-sectional view of a $MoS_2$—GaS heterojunction structure-based high-speed transistor device.

FIG. 7 is an electron microscopic plan view of a $MoS_2$—GaS heterojunction structure-based high-speed transistor device.

FIG. 8 shows the I-V characteristics of a $MoS_2$—GaS transistor according to the present disclosure.

BEST MODE

The present disclosure provides a device with improved characteristics by using the junction characteristics between a two-dimensional material, e.g., a transition metal dichalcogenide compound thin film, and another material adjacent thereto (e.g., a doped silicon substrate or a semiconductor material having a different band gap such as GaS).

In an exemplary embodiment of the present disclosure, the commonly semiconductor silicon and a two-dimensional semiconductor material are used to prepare a photodetecting device exhibiting superior responsivity. In particular, when a van der Waals layered two-dimensional semiconductor is used together with silicon, a PN junction having an ideal step junction or abrupt junction may be formed.

In general, the thickness of a depletion layer of a PN junction can be known if the doping concentration of two semiconductors is known. The present disclosure is advantageous in that the control of material characteristics corresponding to the thickness of the depletion layer (e.g., noise) is possible through the control of the thickness of the two-dimensional material in atomic layer scale.

In an example of the present disclosure, a photodiode device was prepared using the typical two-dimensional n-type semiconductor $MoS_2$ and p-type doped silicon and photoresponsivity and low-frequency noise characteristics were investigated while controlling the thickness of $MoS_2$. By optimizing the thickness of the two-dimensional material corresponding to the thickness of the depletion layer formed at the PN junction, the photoresponsivity and noise characteristics of the photodiode device can be improved.

In another exemplary embodiment of the present disclosure, a channel material having a heterojunction structure is prepared by forming two-dimensional semiconductor materials having different band gaps (high and low band gaps) and an energy well and a thin layer of two-dimensional electron gas (2DEG) are formed at the interface of the two semiconductors.

The 2DEG channel is well known in the GaAs/GaAlAs heterojunction structure and is used widely for a high-speed transistor because high mobility can be ensured. However, the formation of the two-dimensional semiconductor material has not been researched yet. That is to say, by forming a heterojunction structure through van der Waals junction from a layered two-dimensional material having no dangling bonds in the vertical direction, defects due to lattice mismatch can be removed. In addition, the mobility of the transistor may be increased due to reduced charge scattering and roughness scattering because of softer interface and less traps.

In an exemplary embodiment of the present disclosure, the electronic device is a transistor, wherein a channel material is formed from the two-dimensional semiconductor material and the heterogeneous material. The heterogeneous material may serve as an insulator interrupting leakage current from the gate electrode.

Hereinafter, a device using the junction between a two-dimensional semiconductor material and a heterogeneous material according to the present disclosure is described in more detail through two examples. Example 1 and Test Example 1 are examples of a photodiode using the junction with silicon and Example 2 and Test Example 2 are examples of a transistor device using the junction with a GaS thin film.

Example 1

First, a pattern was formed on a $SiO_2$-deposited silicon wafer with a thickness of 90 nm using a 400 μm²-sized square mask by photolithography and the $SiO_2$ was etched by immersing the sample in a buffered oxide etchant (BOE) for 2 minutes.

Then, $MoS_2$ crystal flakes were mechanically exfoliated from another $SiO_2$-deposited silicon wafer with a thickness of 90 nm using a Scotch tape. Then, $MoS_2$ with a thickness of 20-90 nm was detected using a microscope. Polypropylene carbonate (PPC) was spin-coated onto the desired $MoS_2$ flakes. Then, a PN junction was formed by transferring $MoS_2$ to the sample with the $SiO_2$ etched in square shape using polydimethylsiloxane (PDMS), an aligning apparatus and a microscope. Then, an electrode was patterned by photolithography and Ti/Au (10 nm/40 nm) was deposited by thermal deposition, followed by lift-off.

Example 2

$MoS_2$ crystal flakes were mechanically exfoliated from a $SiO_2$-deposited silicon wafer with a thickness of 90 nm using a Scotch tape. Then, thin $MoS_2$ flakes with a thickness of 10 nm were detected using a microscope. For formation of source and drain electrodes of a transistor, patterning was performed by photolithography. Then, after depositing Ti/Au (10 nm/40 nm) by thermal deposition, lift-off was conducted. Then, GaS crystal flakes were mechanically exfoliated from another 90-nm $SiO_2$ wafer using a Scotch tape. Polypropylene carbonate was spin-coated onto the thin GaS flakes. Then, thin GaS flakes were transferred onto the prepared $MoS_2$ source-drain device using PDMS, an aligning apparatus and a microscope. After patterning a gate electrode by photolithography and depositing Pd/Au (2 nm/20 nm) by thermal deposition, lift-off was conducted.

Test Example 1

FIG. 1 shows a cross-sectional view of the Si—$MoS_2$ photodiode of the present disclosure and a condition for optical experiment.

Referring to FIG. 1, the photodiode has the n-type two-dimensional semiconductor material thin film ($MoS_2$) formed on the p-type silicon substrate. The photodiode shown in FIG. 1 was tested by grounding the electrode contacted with silicon, applying a voltage to $MoS_2$ and the grounded electrode and irradiating a laser light to the Si—$MoS_2$ PN junction.

FIG. 2 is an optical microscopic image of the Si—$MoS_2$ photodiode prepared according to an exemplary embodiment of the present disclosure and FIG. 3 shows a result of measuring photoresponsivity depending on the thickness of $MoS_2$.

Referring to FIG. 3, the Si—$MoS_2$ photodiode prepared from $MoS_2$ with a thickness of 48 nm showed the highest photoresponsivity.

FIG. 4 shows a result of analyzing the low-frequency noise characteristics of the photodiode prepared according to an exemplary embodiment of the present disclosure depending on the thickness of $MoS_2$.

Referring to FIG. 4, it can be seen that the noise intensity was the lowest when the thickness was 48 nm. Through this, it can be seen that photoresponsivity and noise characteristics can be optimized by controlling the thickness of the depletion layer of the PN junction by precisely controlling the thickness of $MoS_2$.

Test Example 2

FIG. 5 is the energy band diagram of the $MoS_2$—GaS heterojunction structure-based high-speed transistor device according to the present disclosure.

Referring to FIG. 5, $MoS_2$ has a band gap of approximately 1.2-1.8 eV and GaS has a band gap of 3.3-3.4 eV depending on thickness. Because the two materials have different band gaps and adequate energy band offsets, it is expected that a quantum well and a 2DEG may be formed at the interface of the heterojunction structure. Because GaS forms a Schottky junction with the gate electrode, it can serve as an insulator interrupting gate leakage current.

FIG. 6 is an electron microscopic cross-sectional view of the $MoS_2$—GaS heterojunction structure-based high-speed transistor device.

Referring to FIG. 6, a van der Waals junction with a smooth surface can be formed by forming the two-dimensional layered semiconductor.

FIG. 7 is an electron microscopic plan view of the $MoS_2$—GaS heterojunction structure-based high-speed transistor device.

Referring to FIG. 7, the $MoS_2$—GaS high-speed transistor device may be prepared by a commonly employed photolithography process.

FIG. 8 shows the I-V characteristics of the $MoS_2$—GaS transistor according to the present disclosure.

Referring to FIG. 8, it can be seen from the transfer curve and the output curve that the transistor operates normally.

In the present disclosure, a quantum well (QW) is formed at the interface of two semiconductors due to the conduction band offset. The formed 2DEG is confined in the quantum well and improves electron mobility by reducing impurity scattering because it is spatially apart from inside the gate insulator or the defect present in the $MoS_2$ channel.

In the present disclosure, the quantum well is formed at the interface of the band gap energy-controlled semiconductors. Because the commonly used gate insulator $Al_2O_3$ has lower carrier density than GaS having semiconductor characteristics, it is difficult to form band banding of the $MoS_2$ and, thus, it is difficult to form a quantum dot.

Accordingly, for $Al_2O_3$, the channel of the transistor is not confined and the channel becomes closer to the insulator as the gating electric field is stronger. Also, it is greatly affected by the impurity scattering caused by the defect present inside the insulator.

However, for the crystalline GaS, the effect of gating is smaller because the defect density is lower than the amorphous $Al_2O_3$ and the two semiconductors are formed as two layers. Accordingly, the transistor according to the present disclosure using the GaS—$MoS_2$ structure can increase channel mobility.

The invention claimed is:

1. An electronic device comprising:
    a two-dimensional semiconductor material layer; and
    a heterogeneous material layer disposed on top of and in contact with the two-dimensional semiconductor material layer,
    wherein the heterogeneous material layer is a silicon substrate doped with an impurity of a type different from the two-dimensional semiconductor material layer, and
    wherein the two-dimensional semiconductor material layer is a $MoS_2$ layer.

2. The electronic device according to claim 1, wherein a thickness of a depletion layer of a PN junction between the two-dimensional semiconductor material layer and the silicon substrate is controlled by a thickness of the two-dimensional semiconductor material layer.

3. The electronic device according to claim 2, wherein the electronic device is a photodiode.

4. An electronic device comprising:
    a two-dimensional semiconductor material layer; and
    a heterogeneous material layer disposed on top of and in plane contact with the two-dimensional semiconductor material layer,
    wherein the heterogeneous material layer has a band gap different from the two-dimensional semiconductor material layer, and
    wherein the two-dimensional semiconductor material layer is a $MoS_2$ layer, and the heterogeneous material layer comprises GaS.

5. The electronic device according to claim 4, wherein the electronic device is a transistor and a two-dimensional electron gas (2DEG) is formed in the transistor due to a band gap difference between the two-dimensional semiconductor material layer and the heterogeneous material layer.

6. The electronic device according to claim 5, wherein the heterogeneous material layer is adjacent to a gate electrode of the transistor.

7. The electronic device according to claim 5, wherein the heterogeneous material layer is a crystalline layer and has insulating property of interrupting leakage current when an electric field is applied to a gate electrode of the transistor.

* * * * *